(12) United States Patent  
Hirler et al.

(10) Patent No.: US 7,173,306 B2  
(45) Date of Patent: Feb. 6, 2007

(54) VERTICAL SEMICONDUCTOR COMPONENT HAVING A DRIFT ZONE HAVING A FIELD ELECTRODE, AND METHOD FOR FABRICATING SUCH A DRIFT ZONE

(75) Inventors: Franz Hirler, Isen (DE); Ralf Henninger, München (DE); Frank Pfirsch, München (DE); Markus Zundel, Taufkirchen (DE); Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/927,948

(22) Filed: Aug. 27, 2004

(65) Prior Publication Data

US 2005/0082591 A1 Apr. 21, 2005

(30) Foreign Application Priority Data

Aug. 27, 2003 (DE) .................. 103 39 455

(51) Int. Cl.
*H01L 29/76* (2006.01)

(52) U.S. Cl. ............... 257/329; 257/330; 257/331; 257/341; 257/342; 257/346

(58) Field of Classification Search .............. None
See application file for complete search history.

(56) References Cited

U.S. PATENT DOCUMENTS 4,941,026 A 7/1990 Temple

| 5,973,360 A | 10/1999 | Tihanyi |
| 6,365,462 B2 | 4/2002 | Baliga |
| 2003/0073287 A1 | 4/2003 | Kocon |
| 2004/0063269 A1* | 4/2004 | Kocon ............... 438/206 |
| 2005/0173758 A1* | 8/2005 | Peake et al. ........... 257/330 |

FOREIGN PATENT DOCUMENTS

DE 197 55 868 C1 4/1999

OTHER PUBLICATIONS

Baliga, B., "Power Semiconductor Devices", PWS Publishing, Boston, 1995, (3 pages).

* cited by examiner

*Primary Examiner*—Wai-Sing Louie
(74) *Attorney, Agent, or Firm*—Maginot, Moore & Beck

(57) ABSTRACT

The invention relates to a method for fabricating a drift zone of a vertical semiconductor component and to a vertical semiconductor component having the following features:
- a semiconductor body (100) having a first side (101) and a second side (102),
- a drift zone (30) of a first conduction type which is arranged in the region between the first and the second sides (101, 102) and is formed for the purpose of taking up a reverse voltage,
- a field electrode arrangement arranged in the drift zone (30) and having at least one electrically conducted field electrode (40; 40A–40E; 90A–90J) arranged in a manner insulated from the semiconductor body (100), an electrical potential of the at least one field electrode (40; 40A–40E; 90A–90J) varying in the vertical direction of the semiconductor body (100) at least when a reverse voltage is applied.

21 Claims, 13 Drawing Sheets

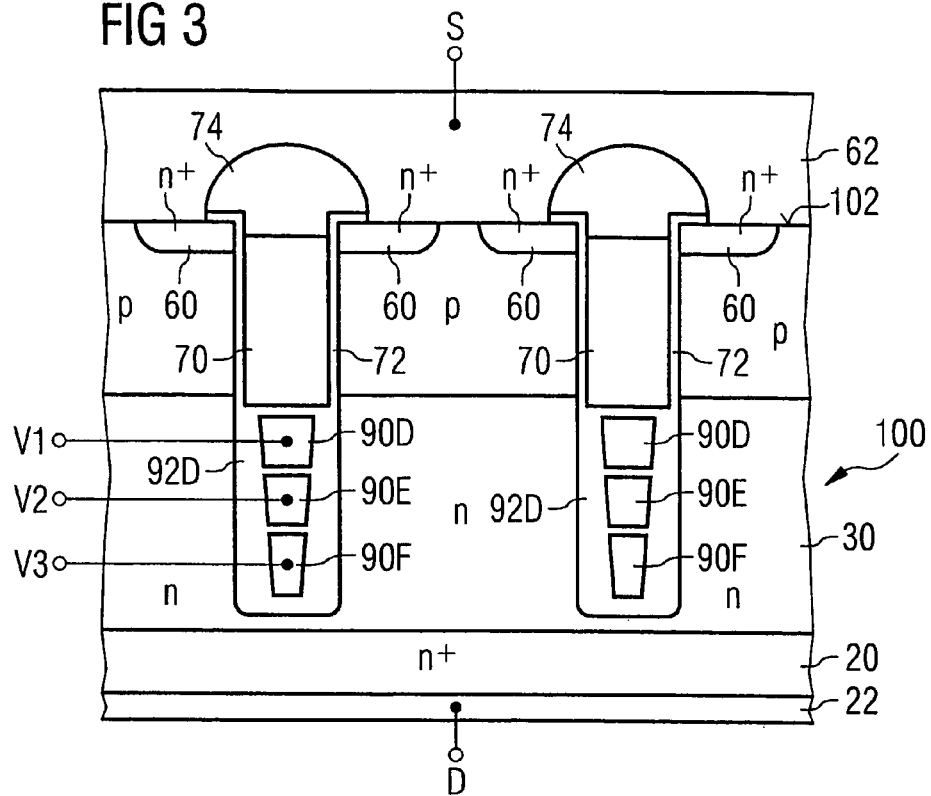
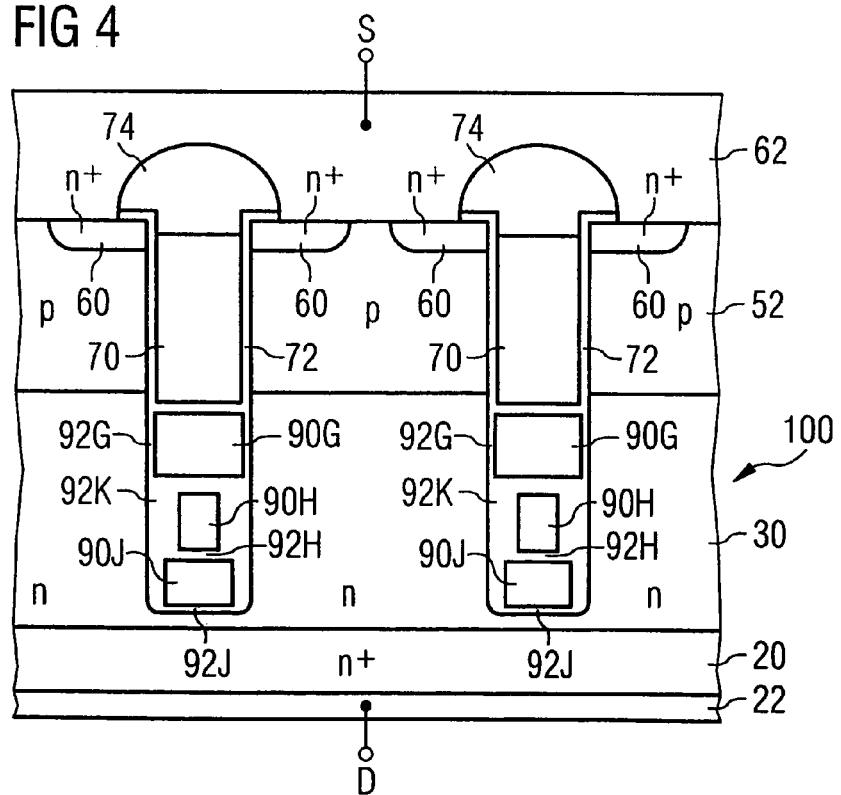

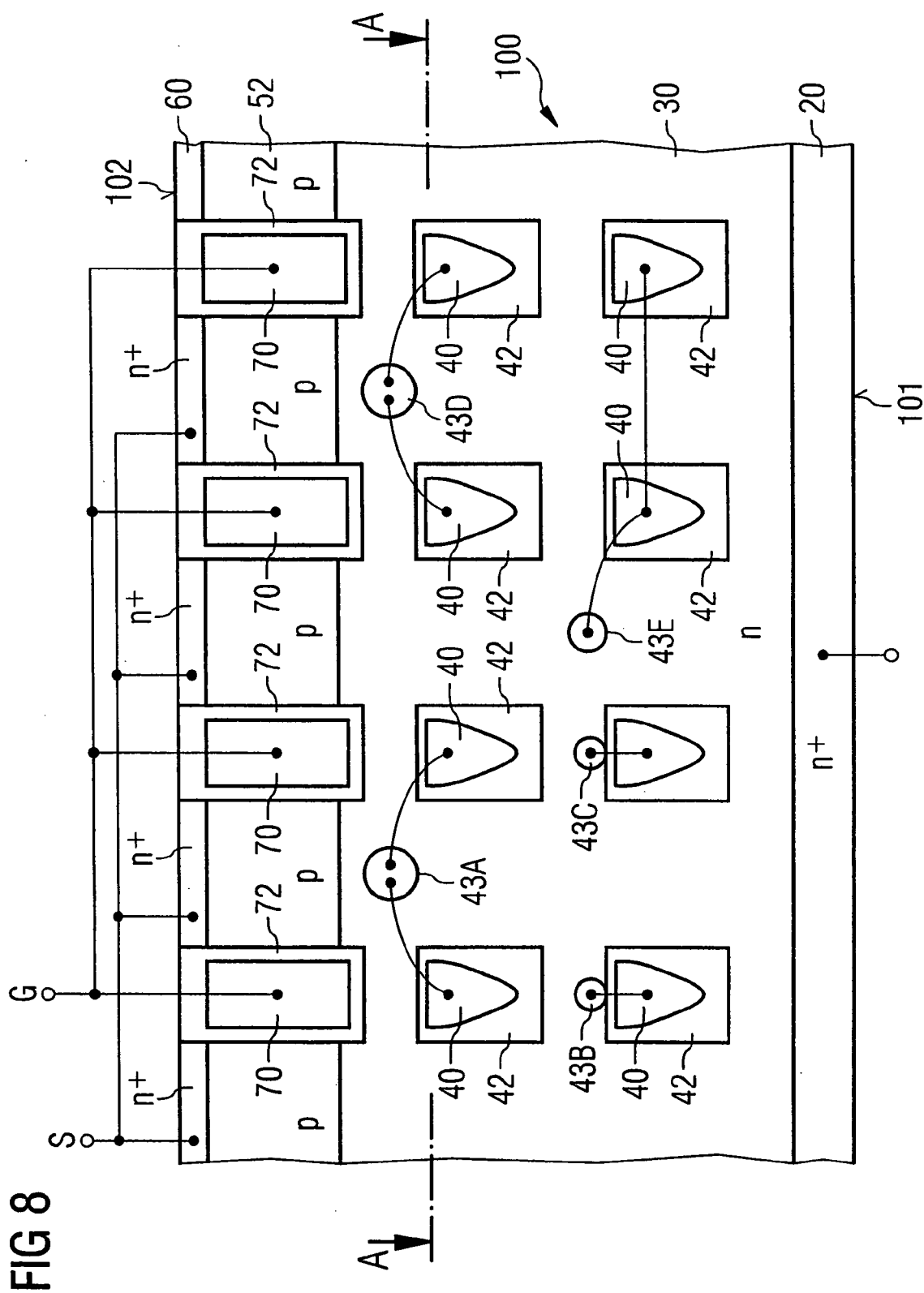

FIG 9A  A-A
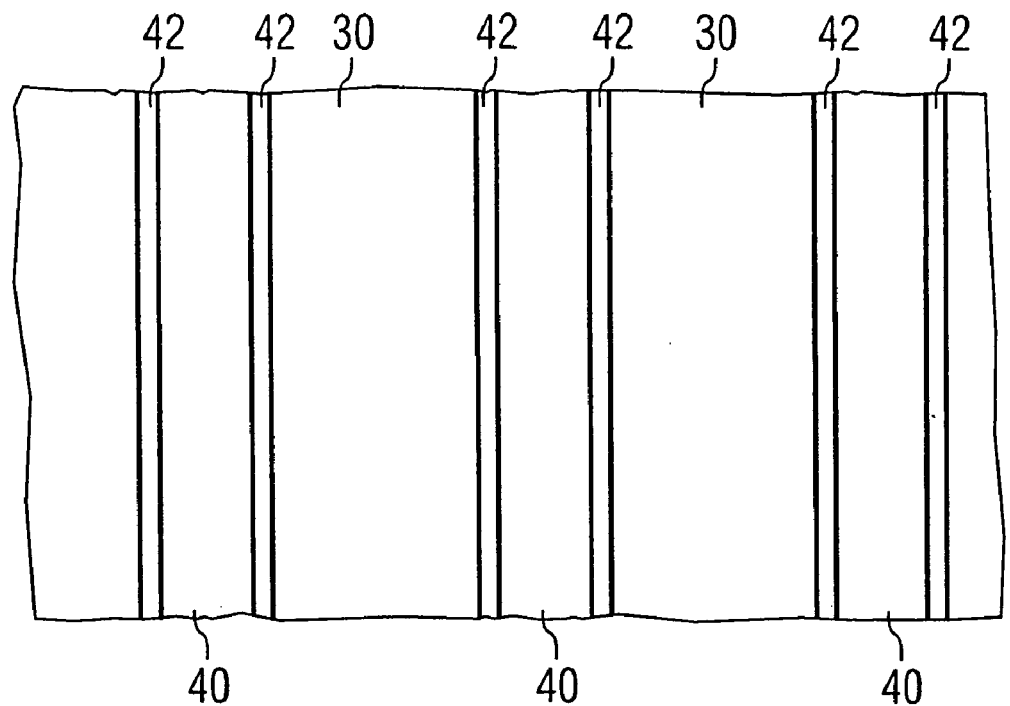
FIG 9B  A-A
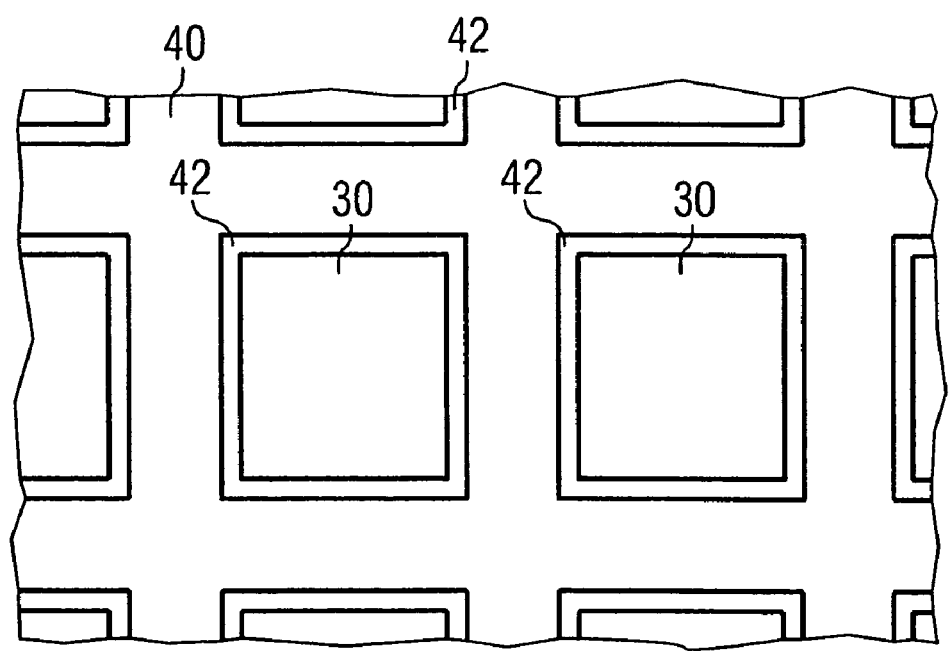

FIG 13A  B-B
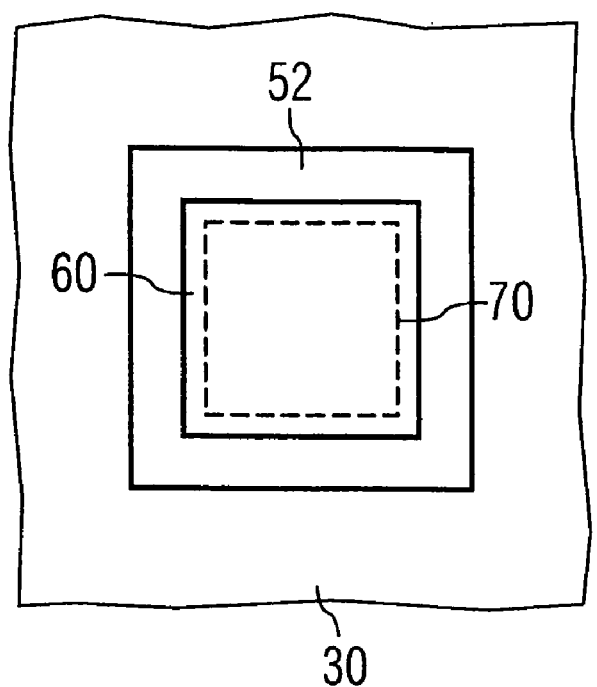
FIG 13B  C-C
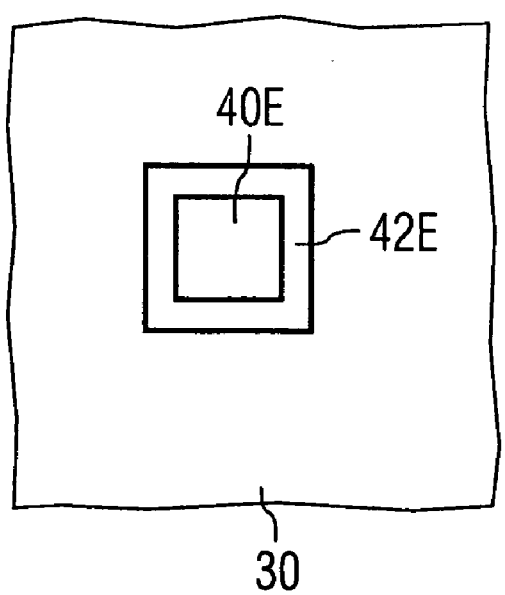

VERTICAL SEMICONDUCTOR COMPONENT HAVING A DRIFT ZONE HAVING A FIELD ELECTRODE, AND METHOD FOR FABRICATING SUCH A DRIFT ZONE

Vertical semiconductor component having a drift zone having a field electrode, and method for fabricating such a drift zone.

BACKGROUND

The present invention relates to a vertical semiconductor component and to a method for fabricating a drift zone of such a component.

Vertical semiconductor components of this type, which are described for example in U.S. Pat. No. 4,941,026 may be formed both as bipolar components, such as diodes, for example, or as unipolar components, such as MOS transistors or Schottky diodes, for example.

In the case of diodes, a second terminal zone of the second conduction type is arranged in the region of the second side of the semiconductor body opposite to the first side, the two complementarily doped terminal zones forming the anode and cathode zones or emitter and collector zones of the diode.

In the case of a vertical MOS transistor a second terminal zone—serving as a source zone—of the same conduction type as the first terminal zone—serving as a drain zone—is present, the source zone being separated from the drift zone by means of a body zone of the second conduction type. A gate electrode formed in a manner insulated from the semiconductor zones serves for forming a conductive channel in the body zone between the source zone and the drift zone.

What is crucial for the dielectric strength of such components, that is to say for the maximum voltage that can be applied between their load terminals before a voltage breakdown occurs, is the configuration, here in particular the doping and the dimensioning in the vertical direction, of the drift zone. The drift zone takes up the majority of the voltage present in the case of components of this type in the blocking state, that is to say in the case of a diode, when a voltage is applied which reverse-biases a pn junction in the anode and the drift zone, and, in the case of a MOS transistor, when a load path voltage is applied and the gate electrode is not driven. A reduction of the dopant concentration of the drift zone or a lengthening of the drift zone increases the dielectric strength, but is detrimental to the on resistance.

The provision of a field electrode arranged in a manner insulated from the drift zone and extending in the vertical direction of the semiconductor body, said field electrode being at a defined potential, compensates for charge carriers in the drift zone. This compensation effect affords the possibility of increasing the drift zone of the component compared with components without such a field electrode with the dielectric strength remaining the same, which in turn leads to a reduction of the on resistance.

U.S. Pat. No. 4,941,026 mentioned above describes putting the field electrode at a fixed potential, which, in the case of a MOSFET, may correspond to the potential at the gate electrode or to the source potential. The voltage loading of an insulation layer that insulates the field electrode from the drift zone varies in this case with the potential that changes in the vertical direction of the drift zone. Under the assumption that the field electrode is at the same potential as one of the load terminals—for example the source terminal in the case of a MOSFET or the anode terminal in the case of a diode-, the voltage loading of the insulation layer is particularly great in the vicinity of the other load terminal—that is to say the drain terminal in the case of a MOSFET or the cathode terminal in the case of a diode.

In order to take account of this potential distribution in the drift zone in the reverse-biasing case and in order to prevent a voltage breakdown from occurring between the drift zone and the field electrode at the locations of the insulation layer which are exposed to a high voltage loading, U.S. Pat. No. 6,365,462 B2 thus proposes varying the thickness of the insulation layer between the drift zone and the field electrode in the vertical direction such that it increases as the voltage loading increases. In the case of the known component, trenches running in the vertical direction of the semiconductor body are formed in the drift zone, zones made of polysilicon which taper in the vertical direction and serve as field electrodes being formed in said trenches. These zones are connected to the anode in the case where the component is configured as a diode, and form a lengthening of a gate electrode arranged in the trench in the case where the component is configured as a trench transistor.

A vertical component having a field electrode tapering in the vertical direction of the semiconductor body is also disclosed in U.S. Pat. No. 5,973,360.

U.S. 2003/0073287 A1 describes vertical power components having a drift zone, in which two field electrodes are provided in a manner spaced apart from one another in the vertical direction of the component, said electrodes being insulated from the drift zone. Said field electrodes are at different potentials during operation of the component.

For lateral components using SOI technology, DE 197 55 868 C1 discloses arranging a plurality of field plates that are insulated from the drift zone along the drift zone and connecting these field plates to sections doped complementarily with respect to the drift zone in the drift zone.

SUMMARY

It is an aim of the present invention to provide a vertical semiconductor component having a drift zone and having at least one field electrode arranged in the drift zone, in the case of which semiconductor component the thickness of the insulation layer surrounding the field electrodes can be reduced compared with conventional components. An aim of the invention is, moreover, a method for fabricating a drift zone of a vertical semiconductor component that has at least one field electrode.

The vertical semiconductor component according to the invention comprises a semiconductor body having a first and a second side, and a third zone of a first conduction type arranged in a region between the first and second sides. A field electrode arrangement having at least one electrically conductive field electrode arranged in a manner insulated from the semiconductor body is provided in said drift zone, the field electrode arrangement being formed in such a way that an electrical potential of the field electrode arrangement, in the reverse-biasing case, is adapted to the potential that rises or decreases in the vertical direction of the drift zone, in order thereby to reduce the voltage loading of the insulation layer surrounding the field electrode compared with conventional components of this type. Thus, in the case of the component according to the invention, it is possible to reduce the thickness of the insulation layer in individual sections compared with conventional components for the same dielectric strength.

The field electrode arrangement may have a field electrode that is insulated from the drift zone by means of an insulation layer, which field electrode is formed in elongate fashion and at which field electrode a first potential is present at an end facing the first side and a second potential is present at an end facing the second side, the two potentials being of different magnitude and thus bringing about a potential across the field electrode that varies in the vertical direction. In this case, the field electrode is formed from a high-impedance material. It goes without saying that in this case the potential is greater at the end faced with the greater potential in the drift zone in the reverse-biasing case.

Moreover, at least two field electrodes arranged in a manner lying one above the other in the vertical direction and insulated from one another may be present, different potentials being present at said field electrodes. These potentials may be produced in various ways.

In one embodiment, provision is made of at least one semiconductor zone of a second conduction type arranged in the drift zone or in a manner adjoining the drift zone, said semiconductor zone being formed in floating fashion in the drift zone, the at least one field electrode being electrically coupled to said semiconductor zone, so that the field electrode assumes the potential of the assigned semiconductor zone.

Preferably, at least two field electrodes arranged in a manner spaced apart from one another in the vertical direction are present, one of which is connected to the floating semiconductor zone and the other of which is connected to a defined potential. This other field electrode semiconductor zone of the second conduction type may be connected to the anode zone in the case of a diode and to the body zone or source zone in the case of a MOSFET.

In the component, when a reverse voltage is applied, a space charge zone forms in the drift zone and propagates in the vertical direction as the reverse voltage increases. In the reverse-biasing case, the at least one semiconductor zone arranged in floating fashion in the drift zone has the effect that the electrically conductive field electrode that is assigned to it and insulated from the drift zone assumes a potential corresponding to the potential of the space charge zone at the position of the floating semiconductor zone. Assuming that the floating semiconductor zone is situated at the level of the field electrode in the vertical direction, the dielectric strength of the insulation layer surrounding the field electrode only has to be as large as the voltage difference in the drift zone between the position of the floating semiconductor zone and the position of that point of the field electrode which is the furthest away in the vertical direction.

If the semiconductor zone arranged in floating fashion is situated just above the field electrode, then the maximum voltage that occurs between the field electrode and the surrounding drift zone corresponds to the voltage drop along the field electrode in the drift zone.

In another embodiment, these different potentials are applied externally. The potentials may be made available for example by field rings which are arranged in the edge region of the component in the drift zone and are doped more heavily than the drift zone. Such field rings are sufficiently known for increasing the dielectric strength of vertical semiconductor components in the edge region in conjunction with field plates for example from Baliga: "Power Semiconductor Devices", PWS Publishing, Boston, 1995, page 102, and may also serve for providing different potentials to be applied to the field electrodes.

A further embodiment provides for tunnel insulation layers, for example tunnel oxides, to be arranged between in each case two of the field electrodes and/or between at least one field electrode and the drift zone. These insulation layers have a defined breakdown voltage and ensure that the potential difference between the drift zone and a field electrode or between two adjacent field electrodes do not exceed a specific value.

The field electrodes are preferably formed in elongate fashion in the vertical direction of the semiconductor body and preferably taper in the vertical direction, so that the thickness of the insulation layer increases in the direction in which the voltage between the individual field electrode and the drift zone increases.

The concept according to the invention can be applied to any desired vertical semiconductor components.

The semiconductor component is formed for example as a diode component and in this case comprises a first terminal zone of the first conduction type, which is doped more heavily than the drift zone and which adjoins the drift zone in the region of the first side. Moreover, a diode component comprises a second terminal zone of the second conduction type, which adjoins the drift zone in the region of the second side. In this case, the first terminal zone forms the cathode zone and the second terminal zone forms the anode zone of this diode component.

In the case where a plurality of field electrodes are provided, the anode zone may be electrically coupled to one of the field electrodes in order to hold this field electrode at anode potential, while other field electrodes are coupled for example to semiconductor zones arranged in floating fashion.

The component may furthermore also be formed as a transistor component and then comprises a first terminal zone of the first conduction type, which is doped more heavily than the drift zone and which adjoins the drift zone in the region of the first side, a second terminal zone of the first conduction type in the region of the second side of the semiconductor body, a channel zone of the second conduction type that is arranged between the second terminal zone and the drift zone, and also a control electrode, which is arranged in a manner insulated from the semiconductor body and which serves, when a drive potential is applied, to form a conductive channel in the channel zone between the second terminal zone and the drift zone. In this case, the first terminal zone serves as a drain zone of the component, the second terminal zone serves as a source zone and the channel zone serves as a body zone.

In the case where a plurality of field electrodes are provided, the body zone may be electrically coupled to one of the field electrodes in order to hold this field electrode at anode potential, while other field electrodes are coupled for example to semiconductor zones arranged in floating fashion.

The field electrodes may be coupled to the semiconductor zones of the second conduction type in any desired suitable manner such that the potential of the field electrodes correspond at least approximately to the potential of the assigned semiconductor zone.

The field electrodes preferably comprise a heavily doped semiconductor material, in particular a semiconductor material of the same conduction type as the at least one semiconductor zone arranged in floating fashion, or a metal.

One embodiment of the invention provides for an insulation layer that surrounds a respective one of the field plates to have a cutout, and for the assigned semiconductor zone of the second conduction type to extend through said cutout as far as the field electrode.

In the case of the method according to the invention, for fabricating an electrically conductive field electrode that is insulated from a drift zone of the first conduction type and is coupled to a semiconductor zone of a second conduction type, which is arranged in floating fashion, the following method steps are provided:

provision of a first semiconductor layer of the first conduction type that has a surface, fabrication of a trench having sidewalls and a bottom in the first semiconductor layer proceeding from the surface, application of an electrical insulation layer to sidewalls and the bottom of the trench, introduction of an electrically conductive material (40E) forming the field electrode into the trench, deposition of a second semiconductor layer of the first conduction type onto the first semiconductor layer with the filled trench, production of a semiconductor zone of the second conduction type, which is arranged in floating fashion, in the second semiconductor layer above the trench.

One embodiment of the method provides for the electrically conductive material that forms the field electrode to comprise a semiconductor material doped with dopants of the second conduction type, the semiconductor zone arranged in floating fashion being fabricated by outdiffusion of dopants of the second conduction type from said field electrode into the second semiconductor zone.

A further embodiment provides for the electrically conductive material that forms the field electrode to be a metallic material, the zone arranged in floating fashion in this case being fabricated by introduction of charge carriers of the second conduction type into the surface of the second semiconductor layer.

Moreover, prior to the deposition of the second semiconductor layer, an insulation layer with a cutout may be applied to the electrically conductive material in the trench.

BRIEF DESCRIPTION OF THE DRAWINGS

The present invention is explained in more detail below using exemplary embodiments with reference to figures.

FIG. 3 shows a second exemplary embodiment of a vertical semiconductor component formed as a trench MOSFET with a plurality of field electrodes arranged in a manner lying one above the other in the vertical direction with varying potential.

FIG. 4 shows a third exemplary embodiment of a vertical semiconductor component formed as a trench MOSFET with a plurality of field electrodes arranged in a manner lying one above the other in the vertical direction, which are coupled in potential terms to the drift zone or to one another by means of tunnel insulation layers.

FIG. 8 shows an exemplary embodiment of a vertical semiconductor component formed as a trench MOSFET with a plurality of field electrodes arranged one above the other in the vertical direction in the drift zone, which are in each case coupled to semiconductor zones of a second conduction type.

FIG. 9 shows, in FIG. 2a, a cross section through the components in accordance with FIGS. 1 to 4 and 8 for the case of a transistor comprising transistor cells constructed in strip-type fashion and, in FIG. 2b, a cross section through the component in accordance with FIGS. 1 to 4 and 8 for the case of a transistor comprising transistor cells constructed in rectangular fashion.

FIG. 13 shows, in FIG. 13a, a cross section through the component in accordance with FIG. 12 in the sectional plane B—B and, in FIG. 13b, a cross section through the component in accordance with FIG. 12 in the sectional plane C—C for the case of a transistor with a rectangular cell structure.

In the figures, unless specified otherwise, identical reference symbols designate identical structural parts and semiconductor zones with the same meaning.

DESCRIPTION

Figure 1:
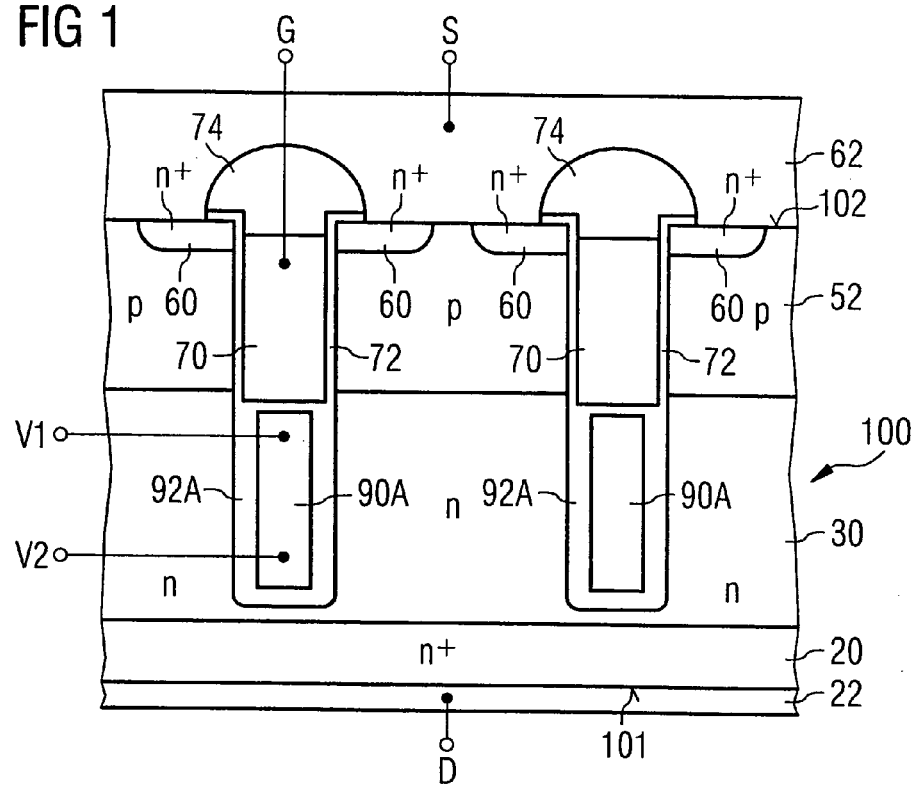
FIG. 1 shows an exemplary embodiment of a vertical semiconductor component formed as a trench MOSFET with a field electrode with varying potential.

FIG. 1 shows, in side view in cross section, an exemplary embodiment of a vertical trench MOSFET constructed in cellular fashion.

The component comprises a semiconductor body 100 having a rear side 101 and a front side 102, the semiconductor body having a heavily n-doped semiconductor zone 20, which forms the drain zone of the component, in the region of the rear side for the purpose of realizing the n-conducting component illustrated. Said drain zone 20 is adjoined in the vertical direction by a drift zone 30, which is doped more weakly than the drain zone 20. n-Doped source zones 60 are present in the region of the front side 102 of the component, and are separated from the drift zone 30 by p-doped body zones 52. Proceeding from the front side 102, trenches extend into the semiconductor body 100 in the vertical direction, gate electrodes 70 being arranged in said trenches in a manner electrically insulated from the semiconductor body by an insulation layer 72, which gate electrodes extend in the vertical direction from the level of the source zones 60 to the level of the drift zone 30 in order, when a suitable drive potential is applied to a gate terminal G, which connects the individual gate electrodes 70 to one another and is only illustrated diagrammatically, to bring about the formation of conductive channels in the body zone 52 between the source zone 60 and the drift zone 30.

The body zone 52 extends in individual sections as far as the front side 102, where the source zone and the body zone 52 are jointly contact-connected by a source electrode 62. The drain zone in the region of the rear side 101 of the semiconductor body is contact-connected by a drain electrode 22.

Below the gate electrode 70, a field electrode 90A is formed in the drift zone 30 in a manner insulated from the drift zone 30, said field electrode being insulated from the drift zone 30 by means of an insulation layer 92A.

Said field electrode 90A is formed in such a way that its electrical potential varies in the vertical direction of the drift zone. This may be achieved for example by virtue of the fact that a first electrical potential V1 is applied to an end of one elongate field electrode which faces the front side 102 or the gate electrode 70 and a second electrical potential V2 is applied to an end facing the rear side or the drain zone, said second electrical potential being greater than the first potential V1 in the example.

The functioning of such a field electrode arrangement is briefly explained below for the reverse-biasing case.

When the gate electrode 70 is driven in blocking fashion and a positive voltage is applied between drain 22, D and source 62, S, the n-conducting component illustrated turns off and a space charge zone propagates proceeding from the body zone 52. In this case, the potential in the drift zone 30 decreases proceeding from the drain zone 20 in the direction of the body zone 52. The potential that increases in the field electrode 90A in the direction of the drain zone 20 has the effect that the voltage loading of the insulation layer 92A in the vicinity of the drain zone is lower than in the case of conventional components in which the field electrode is at a single potential. It follows from this that, in the case of the component illustrated, it is possible to choose a thinner insulation layer than in the case of conventional components.

The different potentials V1, V2 result in a voltage drop across the field electrode 90A with potential values that lie between the first and second potentials.

The first and second potentials V1, V2 may be provided in any desired manner, for example by external potential sources coupled to the ends of the field electrode 90A in a manner that is not illustrated in any greater detail. One embodiment provides for the upper and lower ends of the field electrode 90A to be coupled in each case to different field rings at the front side 102 in the edge region of the semiconductor body.

Figure 2:
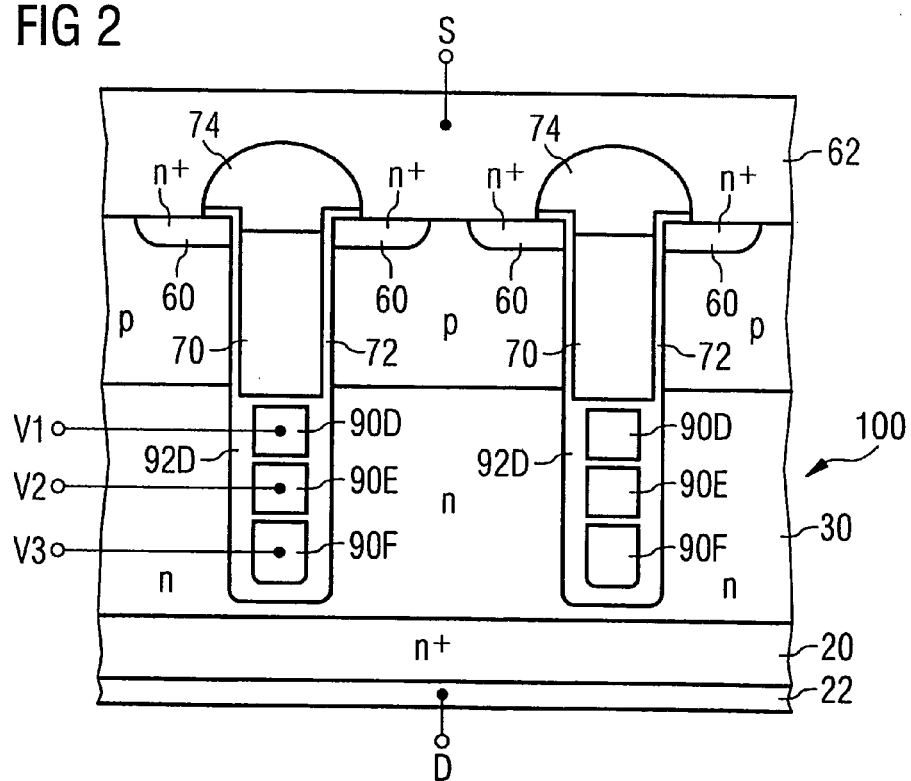
FIG. 2 shows a first exemplary embodiment of a vertical semiconductor component formed as a trench MOSFET with a plurality of field electrodes arranged in a manner lying one above the other in the vertical direction with varying potential.

FIG. 2 shows a modification of the trench MOSFET in accordance with FIG. 1. Instead of one field electrode in accordance with FIG. 1, in the case of the component in accordance with FIG. 2, a field electrode is provided in an arrangement with three field electrodes 90D–90F arranged one above the other in the vertical direction of the drift zone 30, which are insulated from the drift zone 30 and from one another by means of an insulation layer 92D.

Different electrical potentials V1, V2, V3 are applied to the individual field electrodes 90D, 90E, 90F, V1<V2<V3 holding true in the exemplary embodiment illustrated. The thickness of the insulation layer between the individual field electrodes 90D–90F is adapted to the applied potentials V1–V3 such that a voltage breakdown cannot take place between the individual field electrodes. The first potential V1 present at the field electrode 90D corresponds to the source potential, for example. Under the assumption that a voltage V is dropped across the drift zone 30 in the reverse-biasing case, the following preferably holds true for the second and third potential: V3=⅔·V and V2=⅓·V. The maximum voltage loading of the insulation layer 92D surrounding the field electrodes 90D–90F is then ⅓·V and is thus considerably lower than in the case of conventional components in which said voltage loading of the insulation layer corresponds to the entire voltage present between drain and source if the field electrode is at source potential.

In the exemplary embodiment in accordance with FIG. 2, the insulation layer 92D between the field electrodes 90D–90F and the drift zone 30 is of uniform thickness. The exemplary embodiment in accordance with FIG. 3 differs from this: in this exemplary embodiment, three field electrodes 90D–90F are likewise arranged in a manner lying one above the other in the vertical direction, but the thickness of the insulation layer 92D between the field electrodes 90D–90F and the drift zone 30 increases in the direction of the drain zone 20.

Whereas in the exemplary embodiment in accordance with FIG. 3 the thickness of the insulation layer 92D increases altogether in the direction of the drain zone 20, an exemplary embodiment that is not illustrated provides for the thickness of the insulation layer to increase only in each case along the field electrodes.

It is also the case in the exemplary embodiments of a trench transistor in accordance with FIGS. 2 and 3 that the electrical potentials V1–V3 to be applied to the field electrodes 90D–90F may be provided by external potential sources in any desired manner. Furthermore, it is possible also to generate these electrical potentials by means of field rings arranged below the front side 102 in the edge region in a manner that is not specifically illustrated. The provision of such field rings for increasing the dielectric strength in the edge region is sufficiently known from Baliga loc. cit, it also being possible to use these field rings for generating the potentials V1–V3 that are to be applied to the field electrodes.

FIG. 4 shows an exemplary embodiment of a trench MOSFET, in which three field electrodes 90G–90J are arranged in a manner lying one above the other in the vertical direction and insulated from the drift zone 30 and below the gate electrode 70. In the exemplary embodiment in accordance with FIG. 4, so-called tunnel insulation layers 92G–92H–92J are provided for the purpose of setting the electrical potentials of these field electrodes 90G–90J. In this case, the field electrode 90G arranged directly with respect to the gate electrode 72 is insulated from the drift zone 30 by means of such a tunnel insulation layer 92G. The field electrode 90J arranged adjacent to the drain zone 20 is insulated from the drift zone 30 by means of a tunnel insulation layer, and said field electrode 90J and the further field electrode 90H are insulated from one another by means of such a tunnel insulation layer 92H.

These tunnel insulation layers 92G–90J are formed for example as so-called tunnel oxides and have a defined tunnel voltage, thereby ensuring in the exemplary embodiment illustrated that the potential of the field electrode 90J is less than the potential of that section of the drift zone 30 which surrounds the field electrode 90J at most by the value of said breakdown voltage. Furthermore, the potential of the field electrode 90G is less than the potential of that section of the drift zone 30 which surrounds said field electrode 90G at most by the value of said breakdown voltage. The potential of the field electrode 90H is coupled to the potential of the field electrode 90J via the tunnel oxide 92H, as a result of which the potential of said field electrode 90H becomes less than the potential of the field electrode 90J at most by the value of the breakdown voltage of said tunnel oxide 92H.

The exemplary embodiment in accordance with FIG. 4 affords the advantage that the potentials of the field electrodes 90G–90J are established in a manner dependent on the potential of the surrounding drift zone 30.

Figure 5:
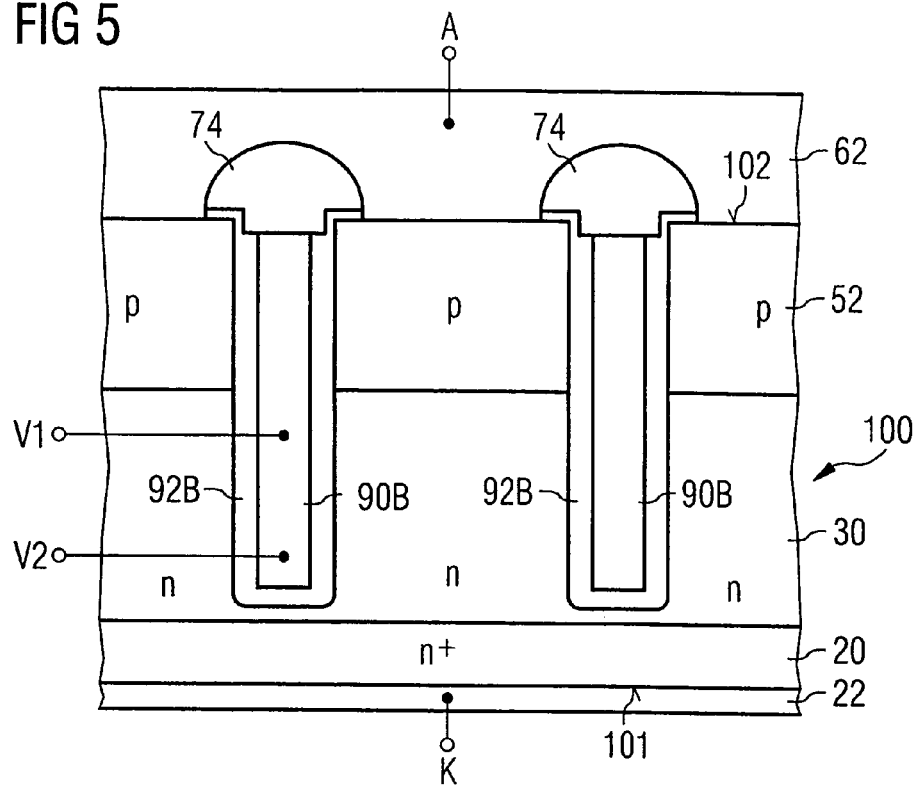
FIG. 5 shows an exemplary embodiment of a vertical pn diode with a field electrode with varying potential.

FIG. 5 shows a vertical semiconductor component that is formed as a pn diode and differs from that illustrated in FIG. 1 essentially by the fact that no source zone 60 and no gate electrode 70 are present. In the case of this component the p-doped semiconductor zone 52 arranged above the drift zone 30 forms the anode zone and the terminal electrode 62 arranged thereabove forms the anode electrode. In the case of the diode component in accordance with FIG. 5, the heavily n-doped semiconductor zone 20 arranged in the region of the rear side 101, which zone forms the drain zone in the case of a MOSFET, forms the cathode zone in the case of said diode component.

In the case of the trench MOSFET explained above, in the case of the diode in accordance with FIG. 5, too, a trench extends into the semiconductor component in the vertical direction proceeding from the front side 102, in which case said trench ends just above the drain zone 20 or may descend into the latter. A field electrode 90B is arranged in the trench in a manner insulated from the semiconductor body 100.

FIG. 5 only illustrates such a field electrode 90B to which a first potential V1 is applied in the transition region between the drift zone 30 and the anode zone 52 and a second potential V2 is applied in the lower region adjacent to the drain zone 20, where V2>V1 holds true. It should be pointed out that the field electrode 90B in particular in the region of the drift zone 30, may, of course, also be formed in accordance with the field electrode arrangement in the region of the drift zone in accordance with FIGS. 2 to 4 explained above.

Figure 6:
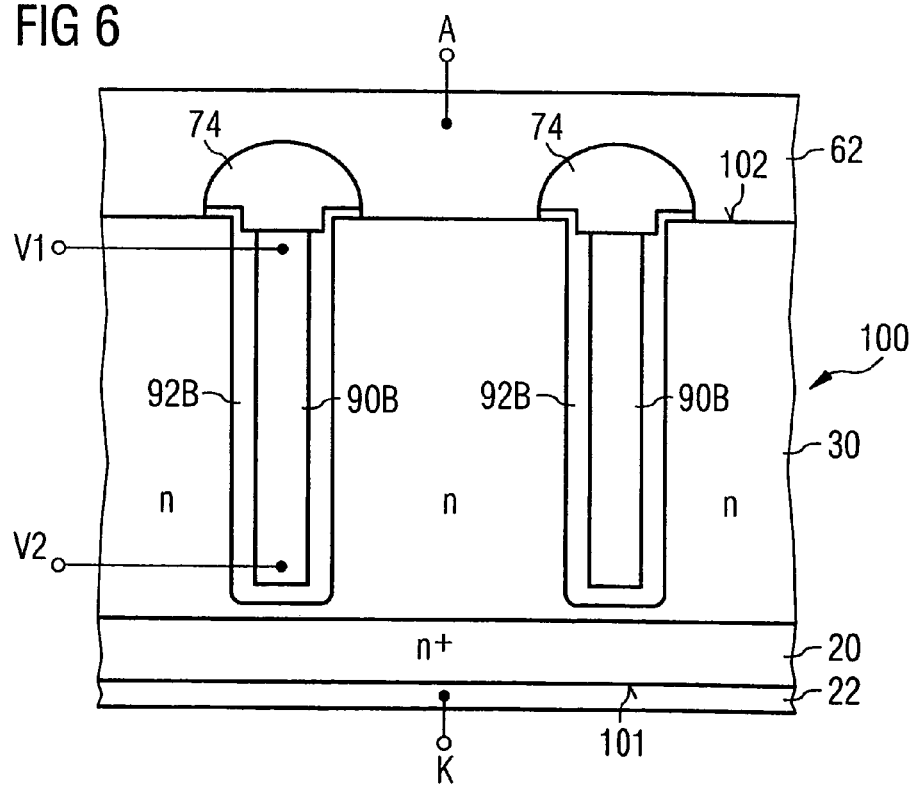
FIG. 6 shows an exemplary embodiment of a vertical Schottky diode with field electrode.

The same applies correspondingly to the Schottky diode illustrated in FIG. 6, which differs from the pn diode illustrated in FIG. 5 essentially by the fact that there is no p-doped semiconductor zone present in the region of the front side 102, rather a terminal electrode 64 is chosen which forms a Schottky contact with the drift zone 30 of the component.

Figure 7:
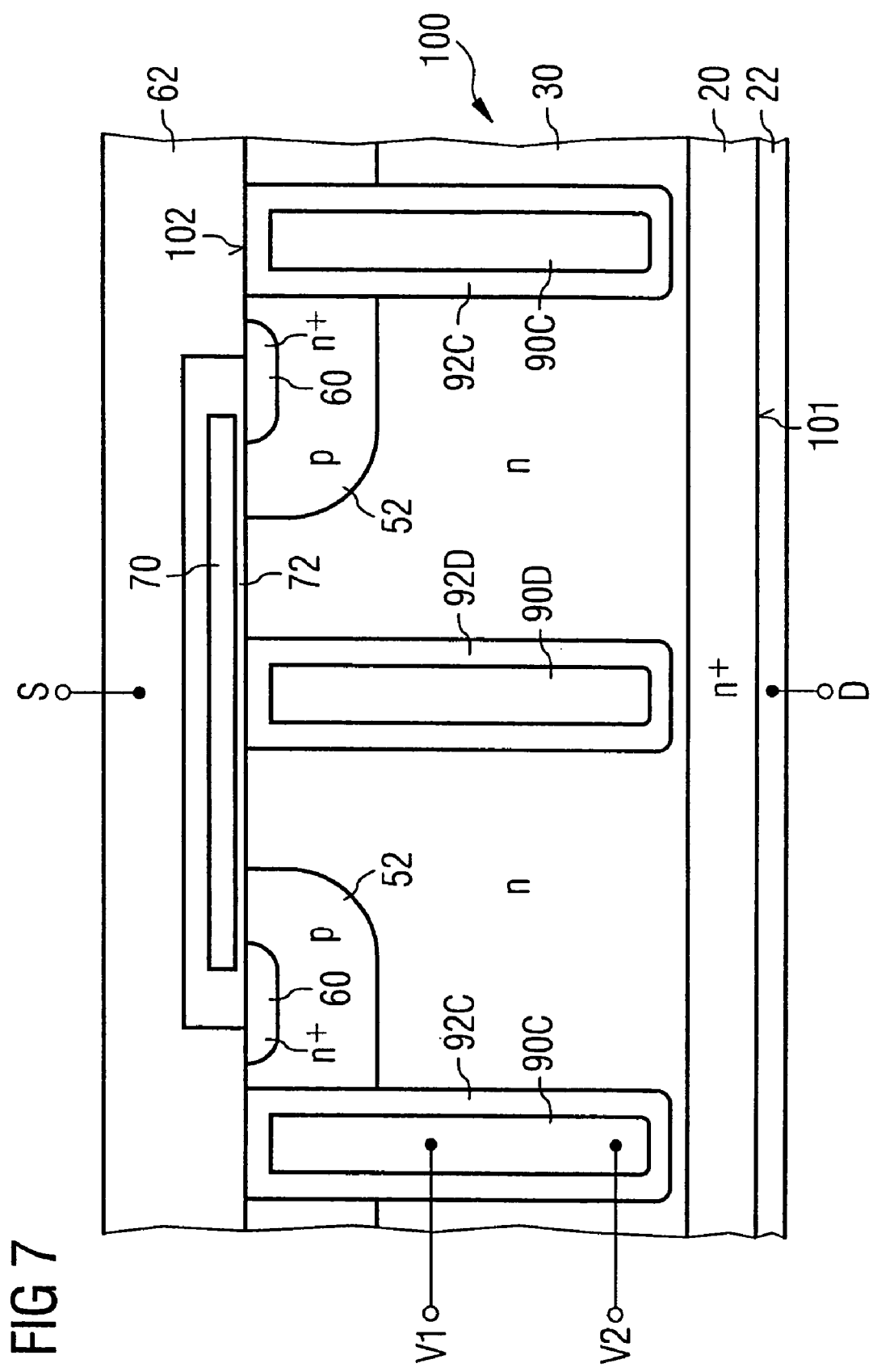
FIG. 7 shows an exemplary embodiment of a vertical MOSFET with planar gate electrode and field electrode.

The field electrode concept according to the invention can also be applied to MOSFETs in which the gate electrode 70 is arranged above the front side 102 of the semiconductor body 100, which is illustrated in FIG. 7. FIG. 7 shows an exemplary embodiment of a so-called DMOSFET, in which trenches extend into the semiconductor body 100 in the vertical direction proceeding from the front side 102, field electrodes 90C, 90D being arranged in said trenches. Said field electrodes 90C, 90D are insulated from the semiconductor body 100 by means of insulation layers 92C, 92D. In the exemplary embodiment, trenches with field electrodes extend both through the body zone 52 and directly below the gate electrode 70 proceeding from the front side 102 into the semiconductor body. Although only one such field electrode is illustrated in each trench in FIG. 7, it should be pointed out that these field electrodes may, of course, be formed in the manner illustrated with reference to FIGS. 2 to 4 explained above.

FIG. 8 shows, in side view in cross section, a further exemplary embodiment of a vertical trench MOSFET constructed in cellular fashion.

The component comprises a semiconductor body 100 having a rear side 101 and a front side 102, the semiconductor body having a heavily n-doped semiconductor zone 20 which forms the drain zone of the component, in the region of the rear side for the purpose of realizing the n-conducting component illustrated. Said drain zone 20 is adjoined, in the vertical direction, by a drift zone 30, which is doped more weakly than the drain zone. N-doped source zones 60 are present in the region of the front side 102 of the component, and are separated from the drift zone 30 by p-doped body zones 52. Proceeding from the front side 102, trenches extend into the semiconductor body 100 in the vertical direction, gate electrodes 70 being arranged in said trenches in a manner electrically insulated from the semiconductor body by an insulation layer 72 which trenches extend in the vertical direction from the level of the source zones 60 to the level of the drift zone 30, in order, when a suitable drive potential is applied to a gate terminal, which connects the individual gate electrodes 70 to one another and is only illustrated diagrammatically, to bring about the formation of conductive channels in the body zone 52 between the source zone 60 and the drift zone 30.

At least two field electrodes 40 arranged in a manner lying one above the other in the vertical direction of the semiconductor body are provided in the drift zone 30. the field electrodes comprise an electrically conductive material and are insulated from the drift zone 30 by insulation layers 42.

In the present case, said field electrodes are in each case arranged below the gate electrodes 70 in order, in an elongation of the body zone 52, to leave free a conductive channel in the drift zone 30 between the body zone 52 and the drain zone 20.

The geometry of these field electrodes in plane view corresponds for example to the geometry of the gate electrodes 70 arranged in the trench, so that, in the case of so-called strip cells in which the gate electrodes run in elongate fashion perpendicularly to the plane of the drawing illustrated in FIG. 8, the field electrodes 40 and the insulation zones surrounding the field electrodes 40 likewise run in elongate fashion, as is illustrated in the cross section in FIG. 9a.

In the case of cells in a rectangular structure in which the gate electrodes in plane view form a grid with rectangular cutouts in which the source zones 60 and the underlying body zones 52 are arranged, the field electrodes 40 and the insulation zones 42 surrounding the field electrodes 40 likewise form such a grid, as is illustrated in FIG. 9b.

Correspondingly, in the case of hexagonal gate structures, in plane view, the field electrodes likewise have a hexagonal structure in which case the geometry of the compensation structure with the field electrodes may also be independent of the geometry of the cell array. It is pointed out that, in the case of the components explained above with reference to FIGS. 1 to 7, the gate electrodes and field electrodes may be formed in a strip-type or grid-type structure.

The individual field electrodes 40, two of which in each case are arranged one above the other in the vertical direction in the example in FIG. 8, taper downward in the vertical direction, that is to say toward the drain zone 20, in the exemplary embodiment.

In the example, each field electrode 40 is assigned a p-doped semiconductor zone arranged in floating fashion in the drift zone 30, these semiconductor zones being designated by the reference symbols 43A–43E in FIG. 8. Said semiconductor zones 43A–43E may be arranged in the drift zone 30 in different positions relative to the field electrodes 40, various positionings of this type being illustrated in FIG. 8.

The field electrodes 40 are respectively assigned to one of these floating semiconductor zones 43A–43E and are coupled to said semiconductor zones 43A–43E in such a way that they have the same electrical potential as the assigned semiconductor zone 43A–43E. The potential coupling between the field electrodes 40 and the semiconductor zones 43A–43E may be effected in any desired conventional manner, this coupling being indicated merely diagrammatically in FIG. 8 by connecting lines between each field electrode 40 and the semiconductor zone 43A–43E assigned to it.

As is illustrated using the example of the semiconductor zone 43E, it is possible also to connect a plurality of field electrodes 40 to a semiconductor zone, such field electrodes 40 which are situated at one level in the vertical direction of the semiconductor body preferably being connected to a common semiconductor zone.

The semiconductor zones 43B, 43C in the example in accordance with FIG. 1 are situated directly above the insulation layer 42 surrounding the field electrodes 40. The semiconductor zone 43A is assigned to two field plane zones 40, and is situated in the lateral direction approximately in the center between said field electrodes. Finally, FIG. 8 shows a semiconductor zone 43D, which is arranged diagonally above the field electrode 40 and which is additionally coupled to the adjacent field electrode 40 in the lateral direction.

The functioning of these field electrodes 40 and of the semiconductor zones assigned to the field electrodes 43A–43E is briefly explained below.

In the reverse-biasing case of the component, that is to say when a positive voltage is applied between drain D and source S and when the gate electrode 70 is driven in nonconductive fashion, a space charge zone propagates in the drift zone 30 proceeding from the body zone 52, and propagates in the direction of the drain zone 20 as the voltages increases. If the space charge zone reaches one of the semiconductor zones 43A–43E, then the field electrode 40 coupled to the respective semiconductor zone assumes the potential of the space charge zone at the position of the assigned floating semiconductor zone 43A–43E.

In order, in the reverse-biasing case, to hold the field electrodes 40 approximately at the potential of the space charge zone at the level of the field electrode, the semiconductor zones 43A–43E arranged in floating fashion are arranged approximately in the vertical direction at the level of the field electrodes 40 assigned to them. At the level of the assigned floating semiconductor zone 43A–43E, the voltage loading of the insulation layer 42 surrounding the field electrodes 40 is thus zero, the voltage loading increasing with increasing vertical distance from the floating semiconductor zone. In the examples in which the floating semiconductor zone 43B, 43D is arranged directly above the field electrode, the maximum voltage loading of the insulation layer 42 corresponds to the voltage drop along the assigned field electrode 40 in the drift zone 30. In order to combat the voltage loading that increases in the vertical direction in this case, the thickness of the insulation layer 42 increases with increasing distance from the floating semiconductor zone.

Figure 10:
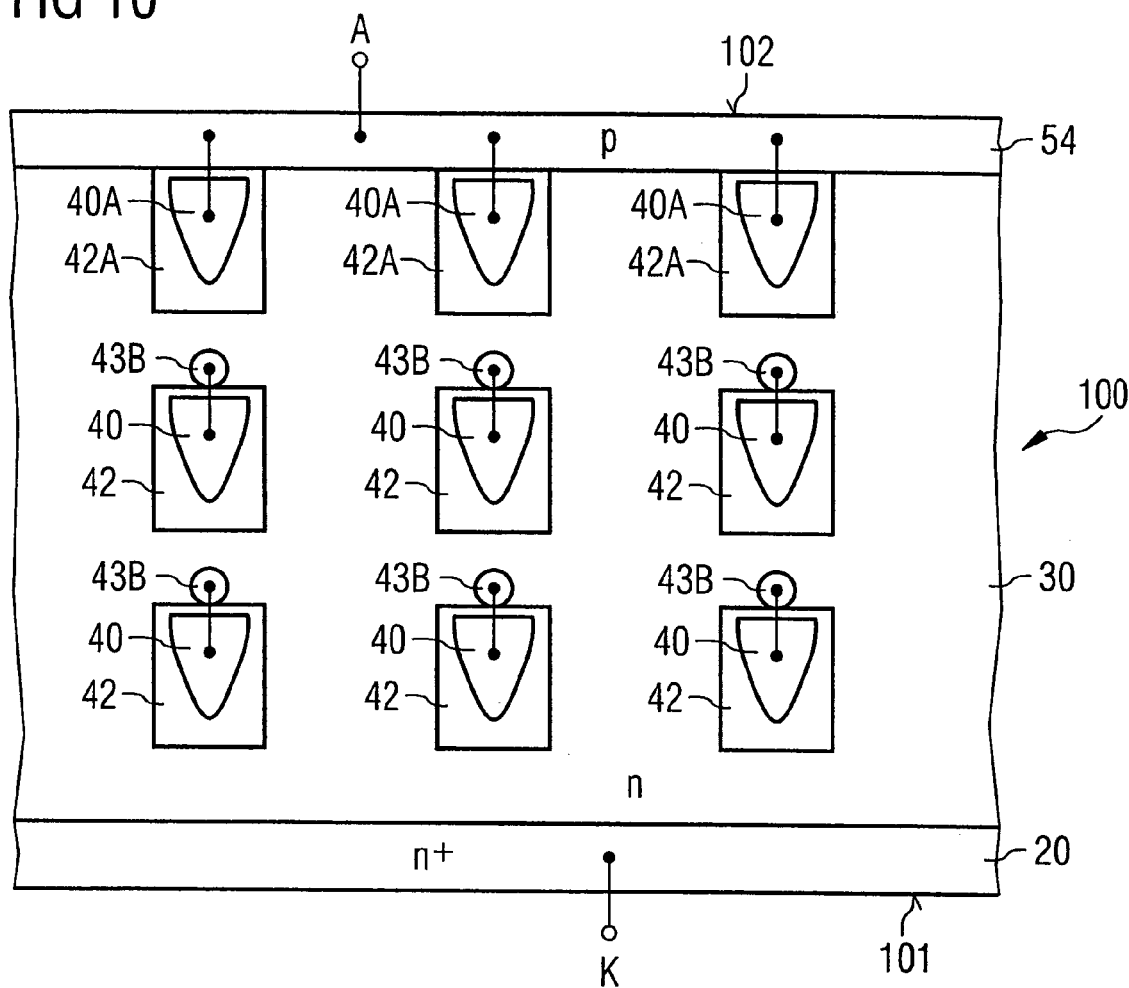
FIG. 10 shows a vertical semiconductor component formed as a diode with a plurality of field electrodes arranged one above the other in the vertical direction in the drift zone, which are in each case coupled to semiconductor zones of a second conduction type.

FIG. 10 shows, in side view in cross section, an exemplary embodiment of a semiconductor component according to the invention that is formed as a diode and has a semiconductor body 100 having a heavily n-doped semiconductor zone 20 in the region of the rear side 101, said semiconductor zone 20 serving as a cathode zone of the diode. Said cathode zone 20 adjoins a drift zone 30, which is doped more weakly than the cathode zone 20, a p-doped semiconductor zone 54, which forms the anode zone, being formed in the region of the front side 102.

In the drift zone 30, in the manner already explained, a plurality of field electrodes 40 each surrounded by insulation layers 42 are in each case arranged one above the other in the vertical direction of the drift zone 30.

In the exemplary embodiment in accordance with FIG. 10, each field electrode 40 is assigned a semiconductor zone 43B arranged in floating fashion, which is in each case arranged directly above the insulation layer 42 of the field electrodes 40. In this case, the field electrodes 40A that are situated the nearest to the p-doped anode zone 54 are coupled in potential terms to said p-doped anode zone 54, these field plates 40A always having the potential of the anode zone 54.

The functioning of the field electrodes 40, 40A in the drift zone 30 corresponds to the function of these field electrodes that has already been explained above with reference to the transistor in FIG. 1. When a voltage that reverse-biases the pn junction between the anode zone 54 and the drift zone 30 is applied between the anode terminal A and the cathode terminal K, a space charge zone propagates proceeding from the anode zone 54 and as the reverse voltage increases, in the vertical direction gradually reaches the floating p-doped semiconductor zones 43B and thereby holds the potential of the field electrodes 40, which are coupled in potential terms to said semiconductor zones 43B, at a potential corresponding to the potential of the space charge zone at the position of the semiconductor zones 43B assigned to the field electrodes 40.

Figure 11:
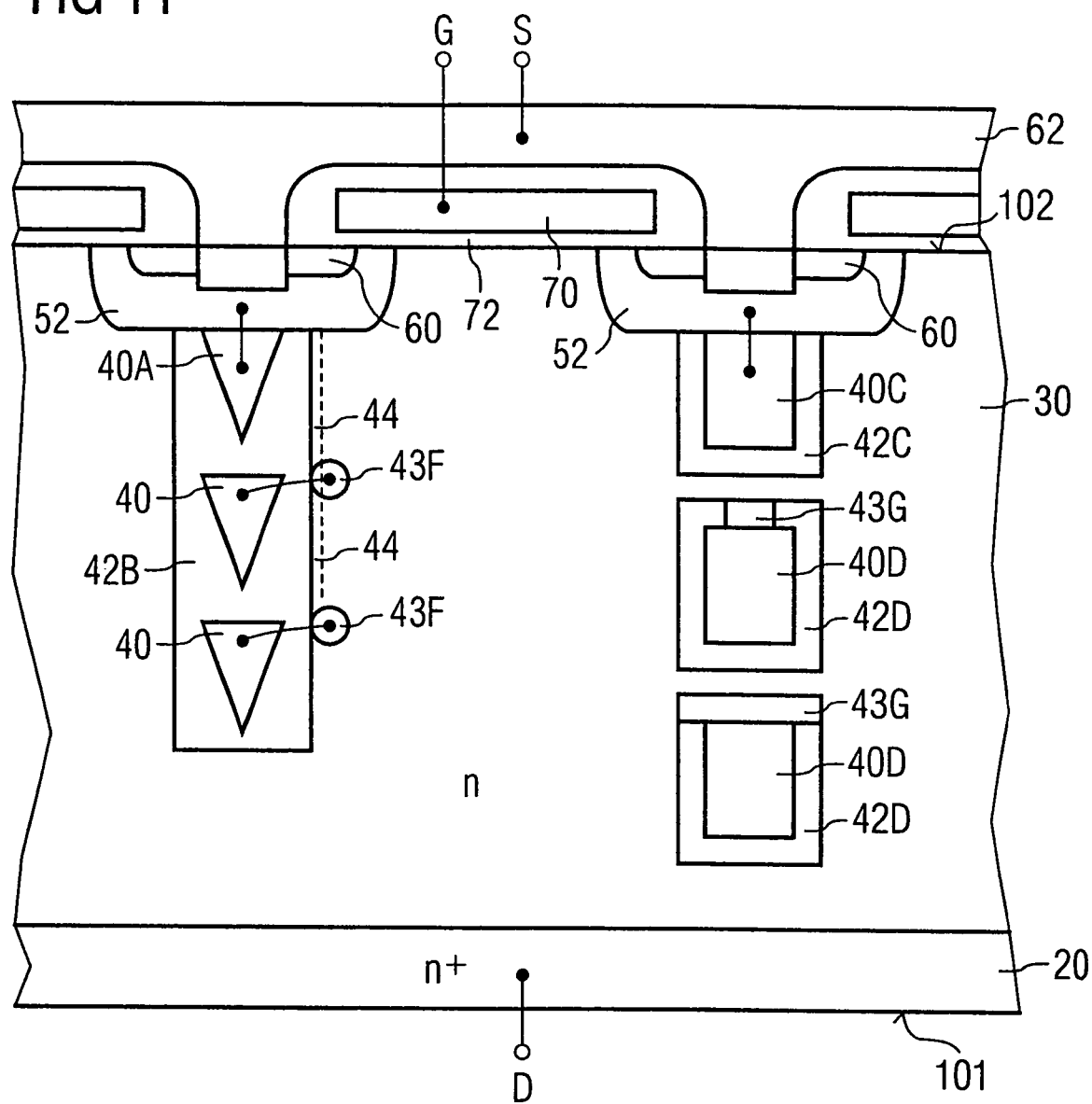
FIG. 11 shows a further exemplary embodiment of a vertical semiconductor component formed as a MOS transistor with different field electrode structures.

FIG. 11 shows, in side view, a cross section through a vertical semiconductor component formed as a DMOS transistor, in which, in contrast to the transistor in accordance with FIG. 8 and in a manner corresponding to the component in FIG. 7, the gate electrode 70 is arranged above the front side 102 of the semiconductor body 100, sections of the body zone 52 and of the drift zone 30 extending as far as the front side 102, so that when a drive voltage is applied to the gate electrode 70, in the body zone 52, a conductive channel is formed below the front side 102 between the source zone 60 and the drift zone 30.

FIG. 11 illustrates two further possibilities of realization for field electrodes, these field electrodes being designated by the reference symbols 40 and 40A in one case and by the reference symbols 40D and 40C in the other case.

The component is constructed in cellular fashion, the individual cells having, in the manner already explained above, for example a strip-type, rectangular or hexagonal structure. The plurality of field electrodes 40, 40A and 40B, 40C that are in each case arranged one above the other in the vertical direction of the drift zone 30 are arranged below the body zones 52 in the example of the DMOS transistor so that a channel of the drift zone 30 that serves for charge carrier transport is formed below the gate electrode 70 in the drift zone 30.

In the case of the exemplary embodiment of the field electrodes 40, 40A which is illustrated in the lefthand part of FIG. 11, said field electrodes are surrounded by a common insulation layer 42B. In this case, the field electrode 40A arranged the nearest to the body zone 52 is coupled in potential terms to the body zone 52. The further field electrodes 40B are in each assigned a p-doped semiconductor zone 43F which is arranged in floating fashion in the drift zone 30 and to which the respective field electrode 40B is coupled in potential terms. The field electrodes 40 are formed in such a way that they in each case taper in the vertical direction with increasing distance from the assigned floating semiconductor zone 43F, as a result of which the thickness of the insulation layer increases in this direction.

In the reverse-biasing case, the potential of the space charge zone rises in the direction of the drain zone 20. Assuming that the field electrodes 40 are held by the floating semiconductor zone 43F at a potential that prevails in the vertical direction at the upper end of the field electrode 40 in the drift zone 30, the potential difference between the field electrode 40 and the drift zone 30 arranged adjacent to the field electrode 40 in the lateral direction in each case increases in the direction of the drain zone 20, which results in a rising voltage loading of the insulation layer, which is combated by the insulation layer becoming thicker.

The right-hand part of FIG. 11 illustrates a further possibility of realization for the field electrodes, the field electrodes 40C, 40D in this case having a uniform cross section in the vertical direction. The field electrode 40C arranged the nearest to the body zone 52 is coupled in potential terms to the body zone 52.

The further field electrodes 40D are in each case coupled to a p-doped semiconductor zone 43G arranged in floating fashion in the drift zone 30, said semiconductor zone 43G being arranged above the field electrodes 40D and directly adjoining the field electrodes 40D. The dimensions of these p-doped semiconductor zones 43G in a direction perpendicular to the plane of the drawing may be formed for the purpose of covering the field electrode 40D completely or only in sections, an insulation layer 42D being arranged between the field electrodes 40D and the drift zone 30 in regions not covered by the semiconductor zones 43G, as is illustrated for the middle one of the field electrodes 40D in the right-hand part of FIG. 11.

Figure 12:
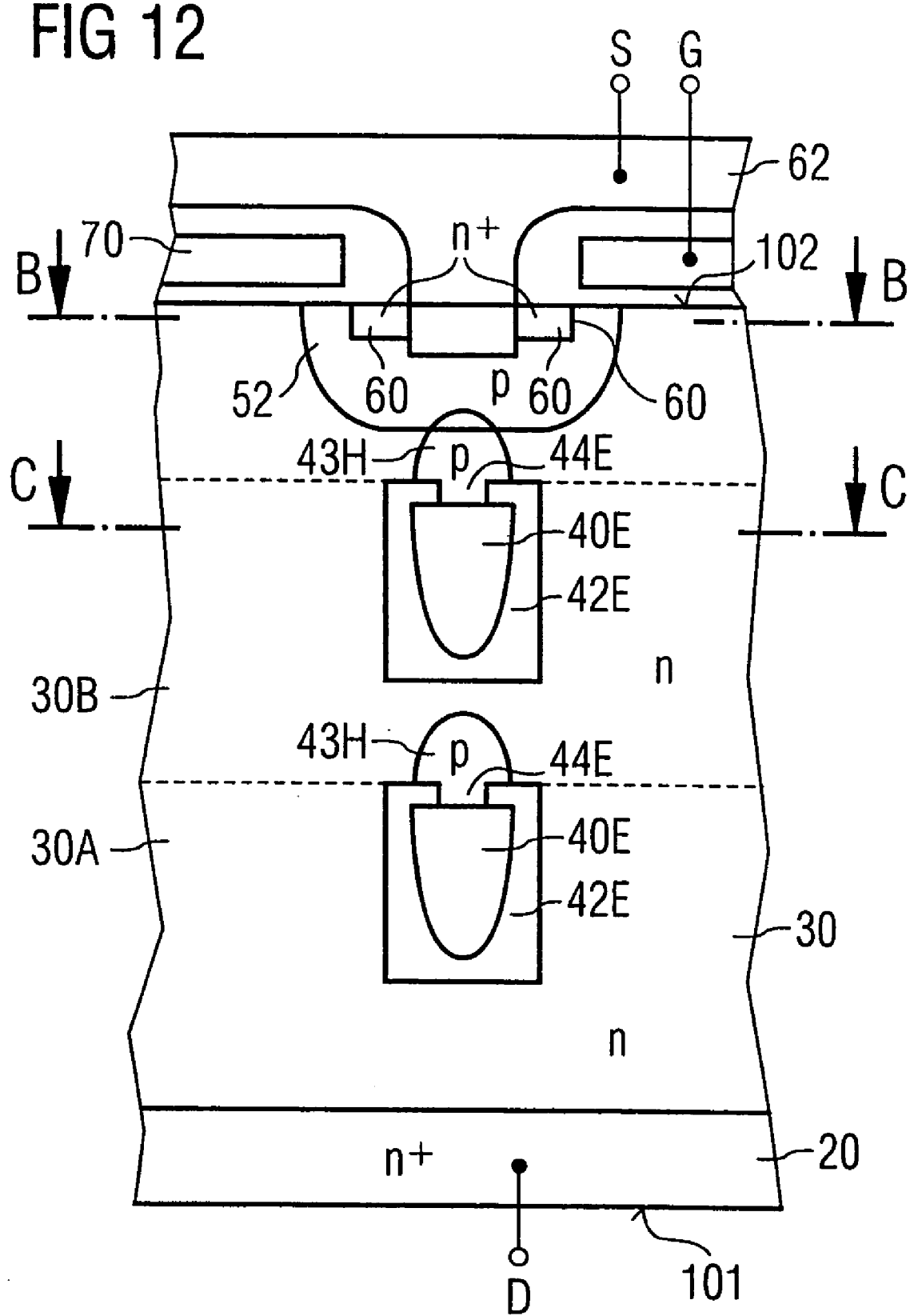
FIG. 12 shows a further exemplary embodiment of a semiconductor component formed as a MOS transistor with field electrodes arranged one above the other in the drift zone.

FIG. 12 shows a further exemplary embodiment of a vertical semiconductor component formed as a DMOS transistor with field electrodes 40E arranged one above the other in the drift zone 30, which are insulated from the drift zone 30 in each case by insulation layers 42E. Said insulation layers 42E each have cutouts 44E in the upper region of the field electrodes 40E, in which cutouts p-doped semiconductor zones in each case extend as far as the field electrodes 42E. In the exemplary embodiment, the semiconductor zone 43H of the field electrode 40e arranged the nearest to the body zone 52 is configured such that this semiconductor zone 43H overlaps the body zone 52, as a result of which the field electrode 40E is essentially at the potential of the body zone 52. The remaining p-doped semiconductor zones 43H are arranged in floating fashion.

FIG. 13a shows a cross section through the component in accordance with FIG. 12 in the sectional plane B—B depicted in FIG. 5, for the case of a component constructed in cellular fashion with rectangularly structured transistor cells. It goes without saying that this transistor cell may also have a hexagonal structure instead of a rectangular structure.

FIG. 13b shows a cross section through the component in FIG. 12 in the sectional plane C—C illustrated, from which it can be seen that the field electrodes 40E and the insulation layer 42E surrounding the field electrodes have a corresponding cross section, that is to say are likewise configured rectangularly in the present case.

A possible fabrication method for the field electrode 40E, the insulation layer 42E surrounding the field electrodes 40E and the semiconductor zone 43H arranged in floating fashion for a component in accordance with FIG. 12 is explained below with reference to FIG. 14.

Figure 14A:
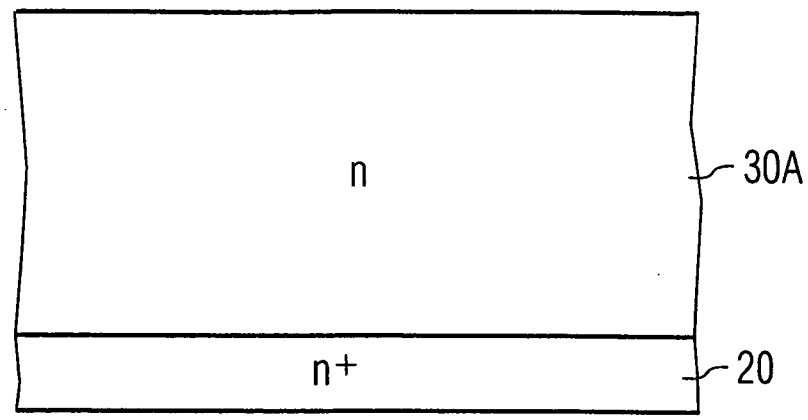
FIG. 14 illustrates a method for fabricating a drift zone of a semiconductor component in accordance with FIG. 12.

Referring to FIG. 14a, the method firstly comprises the provision of an n-doped semiconductor layer 30A, which forms a part of the later drift zone 30. FIG. 14 illustrates the method for fabricating the field electrode 40E arranged nearest to the drain zone 20, so that the semiconductor layer 30A is applied to the drain zone 20 in this example.

Figure 14B:
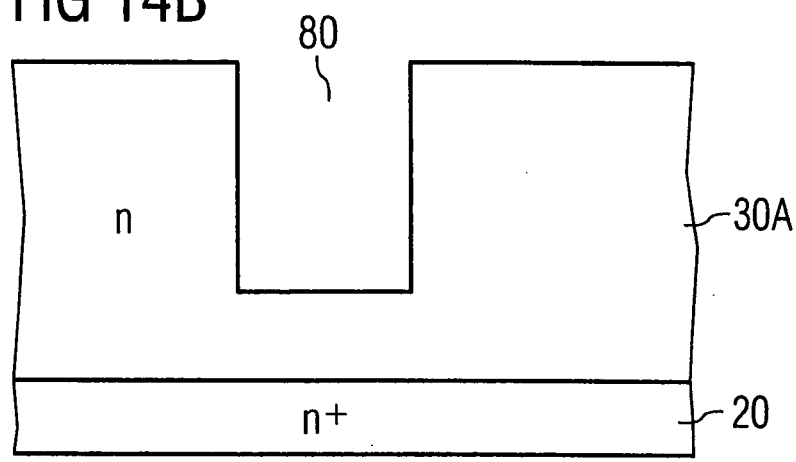

A next method step provides for the production of a trench 80 in the semiconductor layer 30A proceeding from a surface of said semiconductor layer 30A, the result of this being illustrated in FIG. 14b.

Figure 14C:
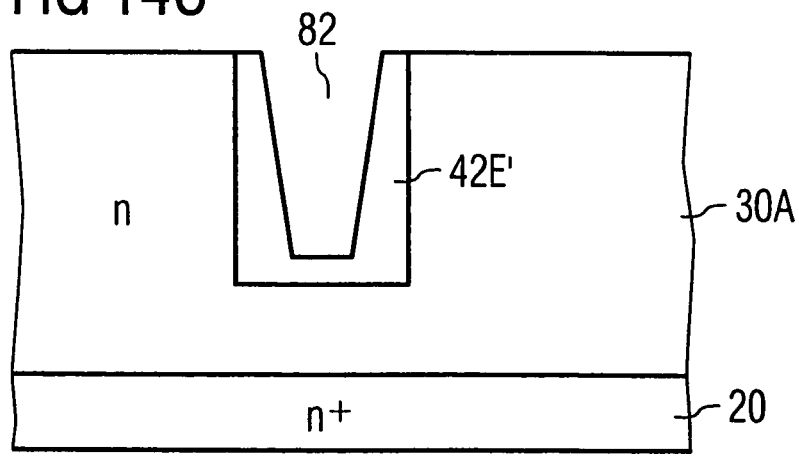

As shown in FIG. 14c, an insulation layer 42E' is subsequently applied to sidewalls and the bottom of the cutout 80, said insulation layer 42E' being formed in such a way that, at the sidewalls of the trench 80, the layer thickness increasing as the trench depth increases, which results in a downwardly tapering cutout in the insulation layer 42E'.

One possible method of fabricating such an insulation layer 42E' with a layer thickness that increases downward at the sidewalls is described for example in U.S. Pat. No. 6,365,462 B2 mentioned in the introduction. As an alternative to the embodiment illustrated in FIG. 14c, it is also possible to form the insulation layer 42E' in such a way that its thickness increases stepwise in the vertical direction as the depth of the cutout 82 increases.

Figure 14D:
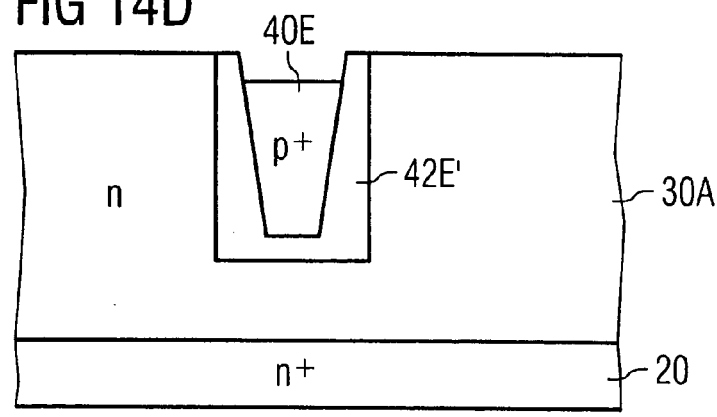

Referring to FIG. 14d, the cutout 82 is then partially filled with a material which has good electrical conductivity and forms the later field electrode 40E. Said material preferably comprises a heavily doped semiconductor material of the second conducting type.

Figure 14E:
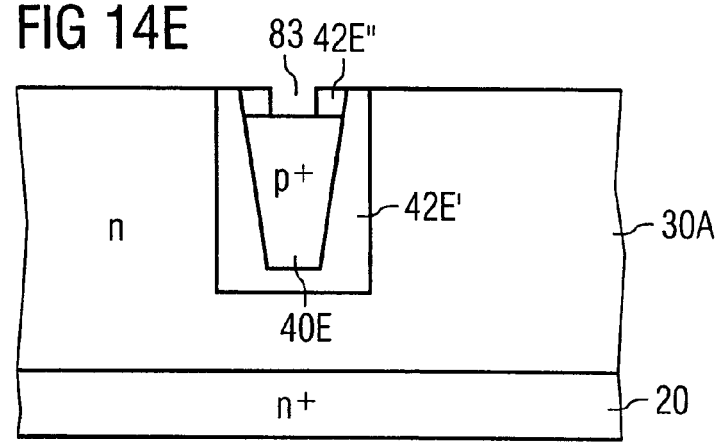
Figure 14F:
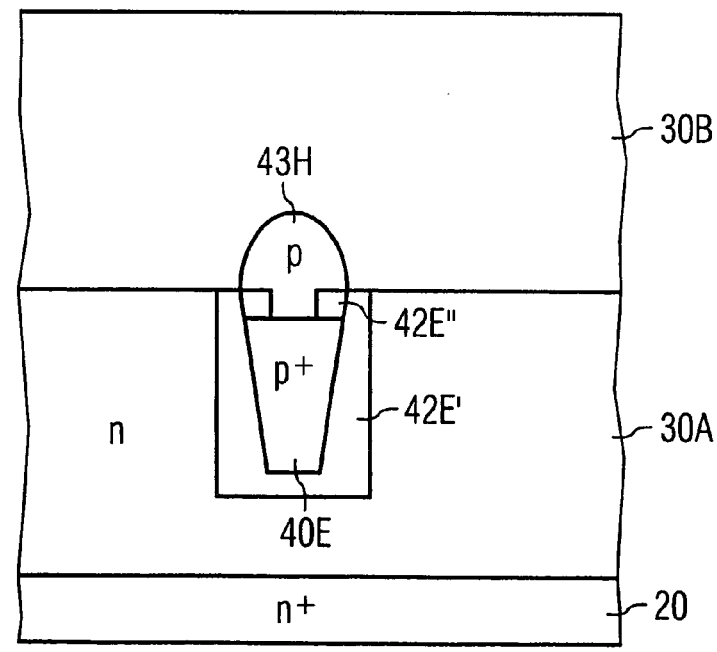

Referring to FIG. 14e, an insulation layer 42E' having a cutout 83 is subsequently applied above the electrically conductive material 40E. This insulation layer 42E" with the cutout 83 may be fabricated for example by application of an oxide layer on the semiconductor material 40E, the cutout 82 subsequently being etched into said oxide layer using a mask technique. Said insulation layer 42E' with the cutout is optional. A semiconductor layer 30B, yet to be explained with reference to FIG. 14f, may also be applied directly to the conductive material.

A second, likewise n-doped semiconductor layer 30B is subsequently applied to the first semiconductor layer 30A, and forms a further section of the later drift zone 30. Said semiconductor layer 30B is preferably applied to the first semiconductor layer 30A by means of epitaxy, semiconductor material also being introduced into the cutout 83 of the insulation layer 42E'. The application of this epitaxial layer 30B is followed by a diffusion step during which p-type dopants outdiffuse from the heavily doped semiconductor zone 40E via the cutout in the insulation layer 42E' in order thus to produce the p-doped semiconductor zone 43H in and around the cutout in the insulation layer 42E'.

The process explained with reference to FIGS. 14a to 14f may be repeated arbitrarily depending on the desired number of field electrodes 40E to be produced. In the method explained, proceeding from the structure in FIG. 14f, there would follow the production of a cutout in the second semiconductor layer 30B etc. In the last epitaxial layer applied, which forms the later front side of the semiconductor component, the body and source zones 52, 60 illustrated in FIG. 12 are then produced in a well known manner. Afterward, the gate electrodes 70 and the source contact 62, which makes contact with the source zone 60 and the body zone 52 and is insulated from the gate electrode 70, are fabricated.

Figure 15A:
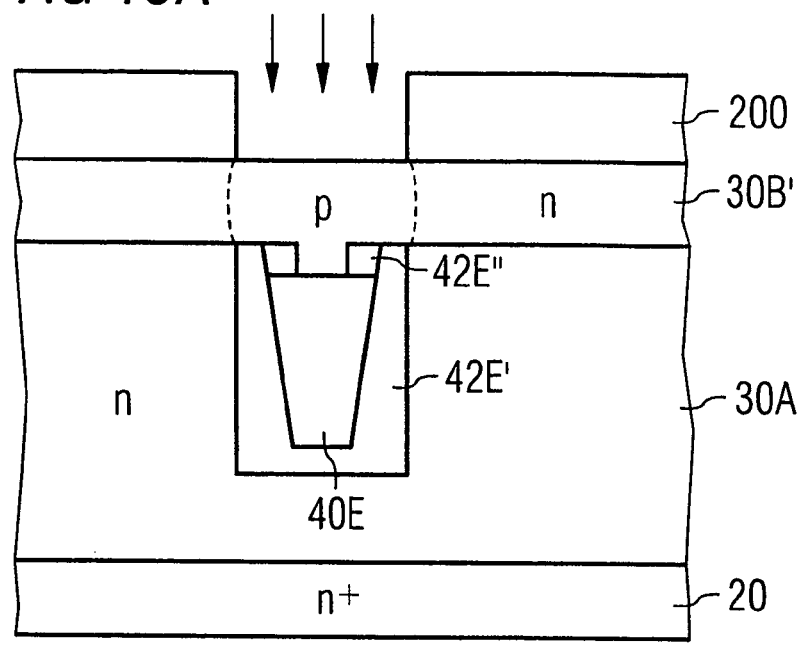
FIG. 15 illustrates a modification of the method in accordance with FIG. 14.
Figure 15B:
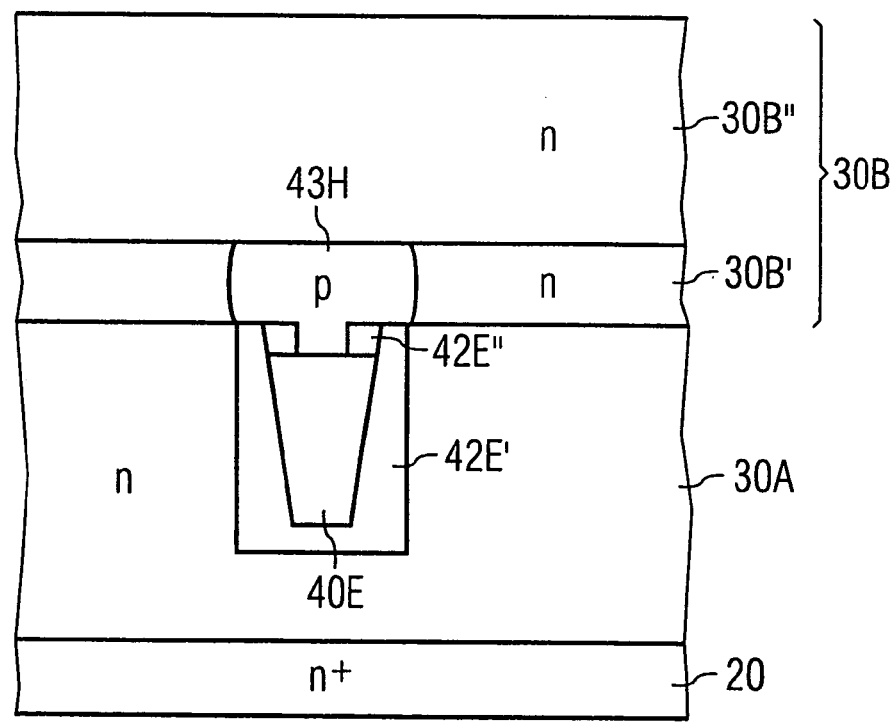

FIG. 15 illustrates a modification of the explained method proceeding from the structure already explained in FIG. 14e with the field electrode 40E and the insulation layer 42E', 42E" that surrounds the field electrode 40E and has a cutout above the field electrode 40E. This modification of the method provides for a metal, for example, to be provided as field plate material. In this case, firstly only a partial layer 30B' of the second semiconductor layer 30B is deposited, and is subsequently p-doped using a mask 200 in a region above the field electrode 40E in order to produce the later semiconductor zone 43H arranged in floating fashion. This doping step is followed by the deposition of a second partial layer 30B2', the first and second partial layers 30B', 30B2' forming the second semiconductor layer 30B.

The insulation layer 42E' laterally surrounding the field electrode and the insulation layer 72E2' that is arranged above the field electrode 40E and has the cutout 83 together form the insulation layer 42E in accordance with FIG. 12, the insulation layer 42E' that becomes thicker at the sides resulting in a downwardly tapering field electrode 40E.

The insulation layer 42E preferably comprises an oxide. As is illustrated in the left-hand part in FIG. 11, the floating semiconductor zones 43F are preferably connected to one another by a more weakly p-doped semiconductor zone 44 and are preferably connected to the body zone 52 in the case of a MOS transistor or the anode zone in the case of a diode. This p-conducting zone is designated by the reference symbol 44 in FIG. 11 and serves for dissipating the charge carriers stored in the floating semiconductor zones 43F more rapidly when the component is switched on again. It goes without saying that a p-doped zone 44 of this type may be provided in all the exemplary embodiments illustrated in the figures in order to connect the floating semiconductor zones 43 to one another.

Finally, it should be pointed out that the floating semiconductor zones of the second conduction type explained above may also be replaced by semiconductor zones of the first conduction type, and thus of the same conduction type as the drift zone, this semiconductor zone of the first conduction type being doped more highly than the drift zone, to be precise being doped so highly that they are not fully depleted in the reverse-biasing.

LIST OF REFERENCE SYMBOLS 100 semiconductor body
101 Rear side of the semiconductor body
102 Front side of the semiconductor body
20 Drain zone, cathode zone
30 Drift zone
30A, 30B Semiconductor layers
30B', 30B" Semiconductor layers
40, 40A–40E Field electrodes
42, 42A–42E Insulation layer
42E', 42E" Insulation layers
43A°–43H semiconductor zones arranged in floating fashion
52 Body zone
54 Anode zone
60 Source zone
80, 82, 83 Cutouts
90A–90J Field electrodes
A Anode terminal
D Drain terminal
G Gate terminal
K Cathode terminal
S Source terminal

The invention claimed is:

1. A vertical semiconductor component comprising:
   a semiconductor body including a first side and a second side;
   a drift zone of a first conduction type positioned in the semiconductor body between the first side and the second side, the drift zone operable to take up a reverse voltage;
   a field electrode arrangement positioned in the drift zone, the field electrode arrangement including at least one electrically conductive field electrode insulated from the semiconductor body; and
   at least one semiconductor zone arranged in floating fashion in the drift zone or arranged in floating fashion adjoining the drift zone, wherein the at least one field electrode is electrically coupled to the at least one semiconductor zone.

2. The semiconductor component of claim 1 wherein the at least one semiconductor zone is of a second conduction type.

3. The semiconductor component of claim 1 wherein the at least one semiconductor zone is of the first conduction type and the at least one semiconductor zone is doped more heavily than the drift zone.

4. The semiconductor component of claim 1 wherein the at least one field electrode is formed such that it tapers in the vertical direction of the semiconductor body.

5. The semiconductor component of claim 1 wherein the at least one field electrode comprises a plurality of field electrodes and the at least one semiconductor zone comprises a plurality of floating semiconductor zones, with each of the plurality of field electrodes assigned to one of the semiconductor zones, and each of the plurality of semiconductor zones arranged in the vertical direction above or beside the field electrode assigned to it.

6. The semiconductor component of claim 2 wherein the at least one field electrode is surrounded by an insulation layer that has a respective cutout through which the at least one semiconductor zone of the second conduction type extends as far as the at least one field electrode.

7. The semiconductor component of claim 1 in which the at least one field electrode comprises a heavily doped semiconductor material or a metal.

8. The semiconductor component of claim 7 wherein the at least one field electrode is of the same conduction type as the at least one semiconductor zone.

9. The semiconductor component of claim 2 wherein the semiconductor component is a diode having a pn junction, the diode comprising:
   a first terminal zone of the first conduction type, the first terminal zone doped more heavily than the drift zone and the first terminal zone adjoining the drift zone in the region of the first side; and
   a second terminal zone of the second conduction type, the second terminal zone adjoining the drift zone in the region of the second side.

10. The semiconductor component of claim 1 wherein the semiconductor component is a Schottky diode, the diode comprising:
   a terminal electrode that adjoins the drift zone on the first side and forms a Schottky contact with the drift zone.

11. The semiconductor component of claim 1 wherein the semiconductor component is formed as a transistor, the transistor comprising:
   a first terminal zone of the first conduction type, the first terminal zone doped more heavily than the drift zone and the first terminal zone adjoining the drift zone in the region of the first side of the semiconductor body,
   a second terminal zone of the first conduction type in the region of the second side of the semiconductor body;
   a body zone of the second conduction type arranged between the second terminal zone and the drift zone; and
   a control electrode insulated from the semiconductor body, the control electrode operable, upon application of a drive potential, to form a conductive channel in the body zone between the second terminal and the drift zone.

12. The semiconductor component of claim 11 wherein the body zone is coupled to one of the field electrodes arranged in a manner lying one above the other in the vertical direction.

13. The semiconductor component of claim 11 wherein the control electrode is formed in a trench extending into the semiconductor body proceeding from the second side.

14. The semiconductor component of claim 13 wherein the at least one field electrode is arranged below the control electrode in the trench.

15. The semiconductor component of claim 11 wherein the control electrode is formed above the second side of the semiconductor body.

16. The semiconductor component of claim 15 wherein the at least one field electrode is formed in a trench extending into the semiconductor body in the vertical direction.

17. A vertical semiconductor component having connection terminals, comprising:
  a semiconductor body including a first side and a second side;
  a drift zone of a first conduction type positioned in the semiconductor body between the first side and the second side, the drift zone operable to take up a reverse voltage;
  a field electrode arrangement positioned in the drift zone, the field electrode arrangement including at least one electrically conductive field electrode insulated from the semiconductor body; and
  at least one semiconductor zone arranged in the drift zone or arranged adjoining the drift zone, the at least one semiconductor zone floating with respect to the connection terminals, wherein the at least one field electrode is electrically coupled to the at least one semiconductor zone.

18. The semiconductor component of claim 17, wherein the connection terminals include a source and a drain of a transistor.

19. The semiconductor component of claim 17, wherein the connection terminals include a cathode and an anode.

20. The semiconductor component of claim 17, wherein the connection terminals comprise a source terminal and a drain terminal, and wherein floating with respect to the connection terminals further comprises being separated by a material other than a conductive material from the connection terminals.

21. The semiconductor component of claim 13, wherein the connection terminals comprise an anode terminal and a cathode terminal, and wherein floating with respect to the connection terminals further comprises being separated by a material other than a conductive material from the connection terminals.

* * * * *